(12) United States Patent
Nasila

(10) Patent No.: US 6,208,216 B1
(45) Date of Patent: Mar. 27, 2001

(54) PHASE-LOCKED-LOOP PULSE-WIDTH MODULATION SYSTEM

(76) Inventor: Mikko J. Nasila, 379 Amlerst St. #127, Nashua, NH (US) 03063

( * ) Notice: Subject to any disclaimer, the term of this patent is extended or adjusted under 35 U.S.C. 154(b) by 0 days.

(21) Appl. No.: 09/406,982

(22) Filed: Sep. 28, 1999

Related U.S. Application Data

(60) Provisional application No. 60/102,032, filed on Sep. 28, 1998.

(51) Int. Cl.$^7$ ........................................... H03K 7/08
(52) U.S. Cl. ........................ 332/110; 332/127; 332/146
(58) Field of Search ................................. 332/109, 110, 332/127, 144, 146

(56) References Cited

U.S. PATENT DOCUMENTS

| | | | |
|---|---|---|---|
| 4,009,455 | * 2/1977 | Ishigaki et al. | 332/127 |
| 4,707,670 | * 11/1987 | Dakin | 332/127 |
| 4,743,783 | 5/1988 | Isbell et al. | |
| 5,489,831 | * 2/1996 | Harris | 318/701 |
| 5,548,679 | 8/1996 | Kiyota. | |
| 5,748,045 | 5/1998 | Tateishi. | |

FOREIGN PATENT DOCUMENTS

| | | |
|---|---|---|
| 433 120 A1 | 6/1991 | (EP). |
| 2 295 060 | 5/1996 | (GB). |

* cited by examiner

*Primary Examiner*—Siegfried H. Grimm
(74) *Attorney, Agent, or Firm*—Scott J. Asmus; Vernon C. Maine

(57) ABSTRACT

A phase-locked loop applied as a phase modulator using an external analog control signal whereby a single-ended pulse-width modulated digital signal may be derived from the phase detector output, and two phase modulated square-wave digital signals may be derived from a reference oscillator and the feedback voltage controlled oscillator. The pulse width modulation and/or phase modulation in power applications can be achieved with far greater speed, precision, simplicity and economy than by existing techniques.

17 Claims, 5 Drawing Sheets

PHASE-LOCKED-LOOP PULSE-WIDTH MODULATION SYSTEM

CROSS REFERENCE TO RELATED APPLICATIONS

This application claims priority from U.S. Provisional Patent Application No. 60/102,032 filed Sep. 28, 1998, which is incorporated herein by reference for all purposes.

BACKGROUND OF THE INVENTION

1. Field of the Invention

The present invention relates to switching and control circuitry in electronic circuits. More specifically, the present invention is a phase modulated phase-locked-loop circuit applied as a pulse width modulator.

2. Background Art

The desire to minimize power losses inherent to linear power devices brought about the development of high-frequency switching techniques, as applied in switching power supplies and class-D amplifiers, among other applications. In these applications, higher frequencies permit more compact magnetics and capacitances, along with higher control-loop response. And although EMI/RFI concerns be come greater at higher frequencies, they also become more manageable. Furthermore, in many applications, such as motor drives, higher frequencies permit easy filtering of the 'chopped' output, producing cleanly linear electrical power, and keeping high-frequency harmonics from inducing eddy currents and other high-frequency effects into the load, and eliminating cable generated EMI concerns.

Although high-speed operation is compelling, it's application challenges magnetic materials and low-loss transistor construction, among other concerns. Of equal concern is a lack of high-speed control techniques, most notably pulse-width modulation (PWM), and phase modulation (PM).

Switching techniques require a digital controller employing pulse-width modulation (PWM) to convert an analog signal to a digital variable duty-cycle representation of it, which, in power electronics can then be used to control power devices (typically some species of transistor). The electric current in a load supplied from a power source is controlled by switching the source to the load through a repetition of "ON" and "OFF".

Although many power topologies use PWM techniques, the buck converter may be the simplest to implement. Furthermore, at low voltages and high speeds, synchronous rectification improves both the efficiency and the response of a buck converter by replacing the free-wheeling diode with a MOSFET.

The function of the PWM in a basic buck converter is shown in FIG. 1. The PWM 90 generates a control signal, which is then buffered 100, and drives the transistor (Q1) 20. Q1 20 in this illustration is a MOSFET transistor. When Q1 20 is "ON", current flows through the circuit, and when Q1 20 is "OFF", the shunt diode to ground (D1) 30 conducts. The duty-cycle of the buffered control signal, is filtered by L1 40 and C1 50, and generates a given output voltage Vout 110. The Vout signal 110 is sampled by the resistive network 60 and input to a comparator 80 along with a reference signal from a reference source 70. An error signal is produced from the comparator 80, is modulated by the PWM, and a new control signal is issued to Q1 20.

A prior art technique for converting an analog signal to a duty-cycle modulated digital is shown in FIG. 2. A reference clock 200 is used to establish a fundamental operating frequency, which is input to a ramp-wave generator 210. The ramp-wave signal is an input to an analog comparator 230 along with the external analog signal 220 that is intended to be pulse-width modulated. The PWM output 240 from the comparator 230 reflects whether the external analog input signal is greater-than or less-than the instantaneous value of the ramp-wave signal. The timing diagrams illustrate the relationship between the various signals. Thus, in the buck converter, the duty-cycle ratio (t/T) of the PWM signal is ideally a direct representation of the ratio of the analog input to the limits of the ramp-wave signal i.e. Vout=Vin(t/T).

This rather simple technique does have certain limitations. The fidelity of the PWM signal to the analog input is determined by the linearity of the ramp-wave signal. The performance of the comparator determines speed, accuracy and jitter. The ramp-wave signal causes the comparator to make decisions in the sub-millivolt region, making it very susceptible to noise-generating false, or multiple pulses. A simple ramp-wave generator is sensitive to the clock period, so spread-spectrum or variable frequency operation requires additional sophistication.

Multiple pulsing can be eliminated using hysteresis, however this has significant disadvantages that are well-known in the art. The multiple pulsing problem can be ameliorated with good design practices. And in some designs the pulsing problems can be debounced using a downstream R-S latch. In general, ramp-wave fidelity and comparator performance can be improved through refinements in design and processes, but these improvements are incremental, and are presently impractical beyond about 500 kHz.

Phase-Locked Loops (PLLs) synchronize a local Voltage Controlled Oscillator (VCO) to an external frequency input by means of an electronic servo loop. A basic digital PLL is illustrated in FIG. 3, and consists of a Phase Detector (PD) 310, a loop filter or Low Pass Filter (LPF) 320, a Voltage Controlled Oscillator (VCO) 330, and an external signal to phase-lock to (Input Frequency) 300.

The PD 310 compares the Input Frequency 300 with the VCO output 340 and generates a signal representing their phase difference. The phase difference signal is filtered through the LPF 320 to get an analog representation of the phase difference. The LPF 320 phase difference output is input to the VCO 330, which then adjusts its frequency to maintain a constant phase relationship between the Input Frequency 300 to produce a phase locked Output Frequency 340.

The basic PLL is readily modified as a phase modulator (PM) by summing an external control signal with the analog phase difference, just prior to input to the VCO. As shown in FIG. 4, a summing section 410 is placed between the LPF 320 and the VCO 330. An external control signal or Analog Modulated Input 400 is input to the summer 410 along with the LPF phase difference output signal. The resultant summed signal alters the VCO frequency, thereby altering the phase difference between the VCO and the Reference Oscillator (RO) or Input Frequency 300. This in turn alters the output of the PD 310, and after filtering in the LPF 320, nullifies the external control signal, thus tracking, in phase, the external control signal.

Analog phase modulators are extensively applied in communications, and are akin to FM. PLLs operate into the hundreds of MHz. The phase modulators demonstrate excellent linearity, and excellent noise tolerance. The analog phase modulator response is largely determined by the loop filter.

There have been attempts to address the aforementioned problems. Phase-locked-loops have found broad utility in communications and data circuits, typically where signals need to be synchronized or modulated. However, power applications have not taken advantage of this technique. The following patents are related in that they use phase-modulated PLL's, and only GB 2295060 uses PLL's in a power application In U.S. Pat. No. 5,748,045, a digital PLL circuit is described for use in the recording area, and is used for recording with a PLL to acquire and synchronize read signals on a rotating magnetic recording medium. A PLL circuit uses a PWM circuit to convert a phase error signal to a pulse width modulation signal, wherein the phase error is a sampled/averaged value.

U.S. Pat. No. 5,548,679 discloses a digital PLL system that uses a phase comparator to convert the phase difference between the reference signal and the feedback signal into a binary value. It describes digital PLL techniques and enhancements. The system uses a frequency comparator to convert the frequency difference between the reference signal and feedback signal into another binary value. An automatic gain controller and PWM signal generator use the binary values to control circuit performance.

In EP0433120A1, there is described a PLL synthesizer circuit that uses the pulse width of a signal corresponding to the phase difference between a reference frequency and the synthesizer circuit oscillation frequency. Essentially this circuit is a pulse width detecting circuit and PLL synthesizer circuit used as a PLL lock detector.

A PLL control circuit is disclosed in GB2295060A, where the control circuit is provided by a phase-lock-loop arrangement with a pulse width modulated drive circuit. This patent describes PLL based circuits for power conversion, however these circuits use PLL to control the classic elements of the ramp-comparison technique.

Other related patents include U.S. Pat. No. 5,872,807, which is a spread spectrum clock generator and associated method, that describes a PLL used for spread spectrum clocking. In U.S. Pat. No. 5,914,984, there is described a method and device for pulse width modulation control using digital methods for generating PWM. And U.S. Pat. No. 5,936,565 discloses a digitally controlled duty cycle integration technique for synchronizing clocks.

What is needed is a way to convert an analog signal to a switched duty-cycle representation of the analog signal without the aforementioned problems. The digital signal can be amplified to the target power level and track the analog modulated input signal. In this manner, a PLL functions as a PWM, and with some external control circuitry, provides output voltage regulation. Such a circuit should reduce cost and complexity of existing switching schemes, reduce cost and real estate in the circuit design and topology. Finally, such a circuit should have excellent linearity and noise tolerance.

SUMMARY OF THE INVENTION

The present invention has been made in consideration of the aforementioned background. It is therefore an object of the invention is to have a phase-modulated PLL applied to PWM and PM applications (hereinafter a PLL-PWM and PLL-PM). Deriving pulse-width or phase modulated signals from a phase-locked-loop operating as a phase modulator gives the advantages of a phase-locked-loop, without the disadvantages of the traditional PWM approach. The linearity of the VCO is only a consideration during capture, and once locked, the VCO operates with very small input variations. A PLL-PWM is almost entirely digital, with the exception of the loop and output filter components, and therefore can operate at higher speeds. The PLL-PWM is much more immune to the effects of noise, because the PLL-PWM is making digital decisions on two free-running clocks, and a VCO is inherently an integrator, so jitter and false triggering concerns are eliminated. Furthermore, the switching frequency of a PLL-PWM can be varied transparently, without altering the PWM duty-cycle, or the PM phase relationship.

The derived pulse-width modulated signal (PWM) is useful in single-ended input type architectures, for example, power-factor correctors, buck, boost, flyback, and half-bridge architectures. The present invention is also applicable where the PWM and it's complement can be used in an anti-phase full-bridge arrangement, such as with class-D amplifiers, where one side of the full-bridge is driven by the PWM signal and the other by it's complement, /PWM.

The derived phase-modulated signals (PM) is useful in compound-switch architectures, such as full-bridge transformer coupled output stages, where one half of the bridge will be driven by the input frequency, and the other by the VCO. This configuration asserts a bridge voltage across the output transformer at a duty-cycle determined by the phase-difference between the input frequency and the VCO.

These signals may be further modified prior to application to the output switch. For example, provisions should be made to permit start-up stabilization before the outputs are enabled; various fault conditions; output disabling; and inserting dead-time, if required.

Using PLLs to generate PWM and PM signals in power electronics overcome all the disadvantages and limitations of conventional PWM techniques, while providing new and beneficial features:
1. PLL-PWM will readily operate at existing PWM frequencies (<20 kHz to >500 kHz), and beyond (the '4046, for example, will operate to 20 MHz).
2. The loop response is almost entirely determined by the loop filter.
3. Linearity determined by the VCO, not the ramp.
4. The VCO forms an integrator, eliminating spurious noise effects.
5. Operating frequency may be varied without altering PWM duty-cycle.
6. The speed-critical components in a PLL are digital, whereas they are analog in conventional PWMs-facilitating implementation efforts and cost.

One objects of the invention is a phase-locked-loop circuit configured as a phase modulator to generate a pulse width modulated signal comprising a reference oscillator which generates a reference oscillator signal, a voltage controlled oscillator which generates a voltage controlled oscillator signal, a phase detector connected to the reference oscillator and the voltage controlled oscillator, wherein the phase detector compares a phase relationship of the reference oscillator signal and the voltage controlled oscillator signal, and wherein the phase detector generates the pulse width modulated signal representing the phase relationship. A power transistor is controlled by the pulse width modulated signal to produce a power pulse width modulated signal. There is a power low-pass filter connected to the power pulse width modulated signal, wherein the power low-pass filter converts the power pulse width modulated signal to an average output voltage. Finally, there is a summing node connected to the power low-pass filter, wherein the summing node generates a difference signal between the average output voltage and an analog modulation input, wherein the difference signal is feedback to the voltage controlled oscillator.

Other objects include the phase-locked-loop circuit, wherein the analog modulation input is fixed. Or, wherein the analog modulation input is variable. And furthermore, wherein the reference oscillator signal is fixed and the voltage controlled oscillator signal is variable.

Another object of the invention is a phase-locked-loop circuit configured as a phase modulator to generate a pulse width modulated signal, further comprising a second low-pass filter connected to the power pulse width modulated signal, wherein the second low-pass filter converts the power pulse width modulated signal to an average feedback voltage value, and wherein the summing node generates a feedback difference signal between the average feedback voltage value and the analog modulation input, and wherein the feedback difference signal is feedback to the voltage controlled oscillator.

An additional object is a phase-locked-loop circuit configured as a phase modulator to generate a pulse width modulated signal, further comprising a second low-pass filter connected to the pulse width modulated signal, wherein the second low-pass filter generates a phase detector voltage. There is a second summing node, wherein the second summing node generates a second difference signal between the difference signal and the phase detector voltage, and wherein the second difference signal is fedback to the voltage controlled oscillator.

And yet another object is a phase-locked-loop circuit configured as a phase modulator to generate two phase modulated signals comprising, a reference oscillator which generates a reference oscillator signal, a voltage controlled oscillator which generates a voltage controlled oscillator signal. There is a plurality of power transistors, wherein a first set of power transistors is controlled by the reference oscillator, and a second set of power transistors is controlled by the voltage controlled oscillator. And, an output power means, wherein a phase modulation between the first and second set of power transistors translates into a power pulse width modulated signal when coupled through the output power means. There is a power low-pass filter connected through a rectifier to the output power means, wherein the power low-pass filter converts the power pulse width modulated signal to an average output voltage. Finally, a summing node is connected to the power low-pass filter, wherein the summing node generates a difference signal between the average output voltage and an analog modulation input, and wherein the difference signal is fedback to the voltage controlled oscillator.

An object includes the phase-locked-loop circuit configured as a phase modulator to generate two phase modulated signals wherein the plurality of power transistors are configured in a full bridge, and wherein the first set of power transistors is on a first leg of the full bridge, and is controlled by the reference oscillator, and the second set of power transistors is on a second leg of the full bridge, and is controlled by the voltage controlled oscillator.

And a further object is the phase-locked-loop circuit configured as a phase modulator to generate two phase modulated signals, wherein the output power means is an output power transformer connected across the full bridge, and wherein the phase modulation between the first and second set of power transistors translates into a power pulse width modulated signal when coupled through the output power transformer.

Additionally, the phase-locked-loop circuit configured as a phase modulator to generate two phase modulated signals includes conditions wherein the analog modulation input is variable. Or, wherein the analog modulation input is fixed. And, wherein the reference oscillator signal is fixed and the voltage controlled oscillator signal is variable.

Yet another object is a phase-locked-loop circuit configured as a phase modulator to generate two phase modulated signals, further comprising a second low-pass filter, wherein the second low-pass filter converts the power pulse width modulated signal into an average feedback voltage, and wherein the summing node generates a feedback difference signal between the average feedback voltage and the analog modulation input, and wherein the feedback difference signal is fedback to the voltage controlled oscillator.

An additional object is a phase-locked-loop circuit configured as a phase modulator to generate two phase modulated signals, further comprising a second low-pass filter connected to the pulse width modulated signal, wherein the second low-pass filter generates a phase detector voltage. Further comprising a second summing node, wherein the second summing node generates a second difference signal between the difference signal and the phase detector voltage, and wherein the second difference signal is fedback to the voltage controlled oscillator.

Another object of the invention is a phase-locked-loop process to generate a pulse width modulated signal comprising the steps of generating a reference oscillator signal, generating a voltage controlled oscillator signal, comparing a phase relationship of the reference oscillator signal and the voltage controlled oscillator signal, and generating said pulse width modulated signal representing the phase relationship. Additional steps include controlling the pulse width modulated signal to produce a power pulse width modulated signal, filtering the power pulse width modulated signal and converting the power pulse width modulated signal to an average output voltage, and finally, generating a difference signal between the average output voltage and an analog modulation input, wherein the difference signal is fedback to the voltage controlled oscillator.

Other objects, features and advantages are apparent from description in conjunction with the accompanying drawings.

DESCRIPTION OF THE PREFERRED EMBODIMENT

Phase-Lock-Loop Circuits (PLL) may be analog, mixed-signal (analog-digital), digital, and may even be implemented in software. Although a PLL-PWM can be implemented with any of these techniques, the output must be digital, with the input typically an analog feedback signal.

Figure 1:
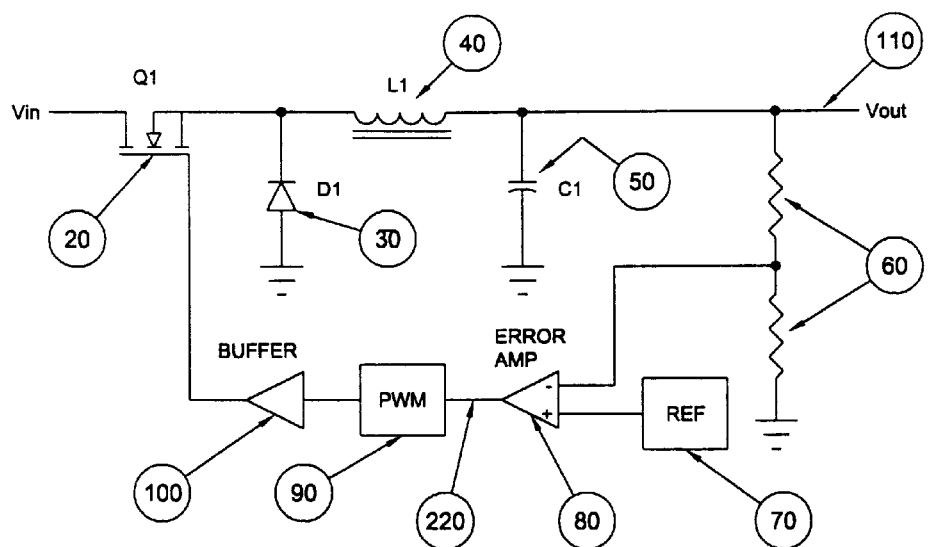
FIG. 1 shows a block diagram of a traditional buck converter utilizing PWM techniques.
Figure 2:
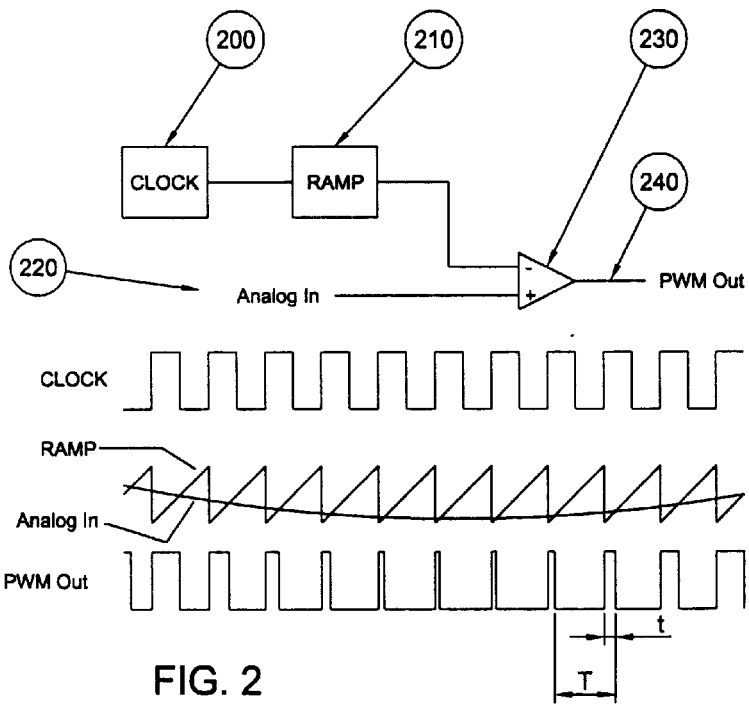
FIG. 2 shows a block diagram of a traditional PWM controller, with associated waveforms.
Figure 3:
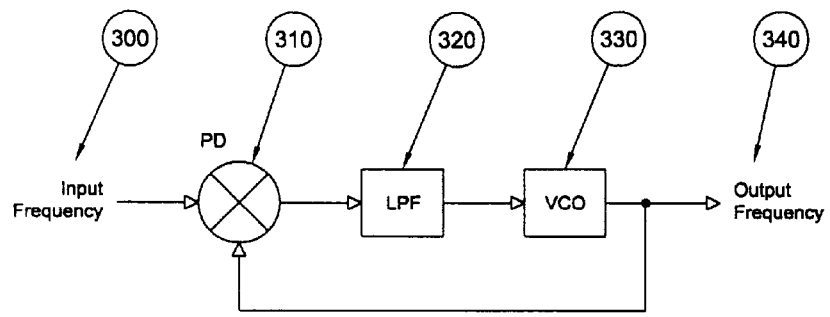
FIG. 3 shows a block diagram of a traditional PLL.
Figure 4:
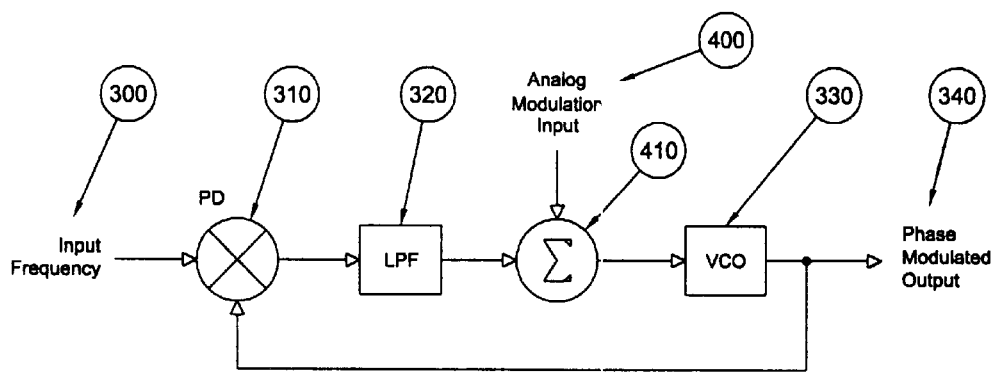
FIG. 4 shows a block diagram of a traditional phase modulated PLL.
Figure 5:
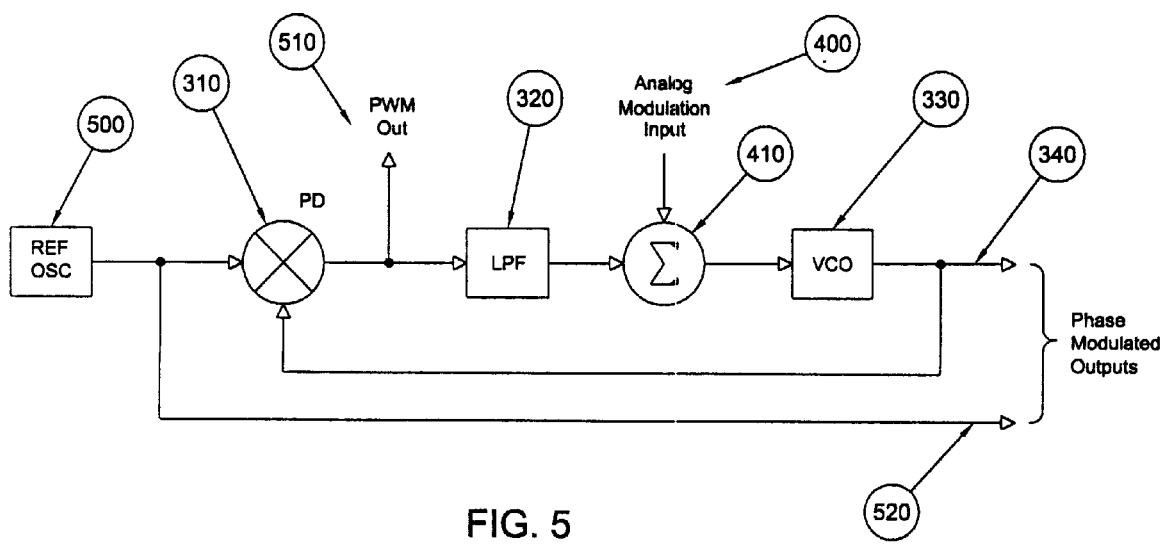
FIG. 5 shows a block diagram of the preferred embodiment of a phase modulated PLL applied as a PWM/PM.

FIG. 5 is a block diagram representation of the present invention. The Reference Oscillator 500 generates the input frequency of the circuit, and one phase modulated output 520. The Reference Oscillator 500 signal is an input to the phase detector 310, along with the VCO signal 340. The difference in phase between the two signals is output from the phase detector 310. The output signal is split into a PWM Out 510 signal and an input to the LPF 320. After filtering by the LPF 320, the output is an input to a summing section 410. The buffered signal is summed with the analog modulation input 400. The summed signal is input to the VCO 330, which generates output 340, which is phase modulated from the Reference Oscillator output 520.

An application will typically use only the PWM Out 510, or the two PM signals 340 and 520, depending upon the power topology.

Figure 6:
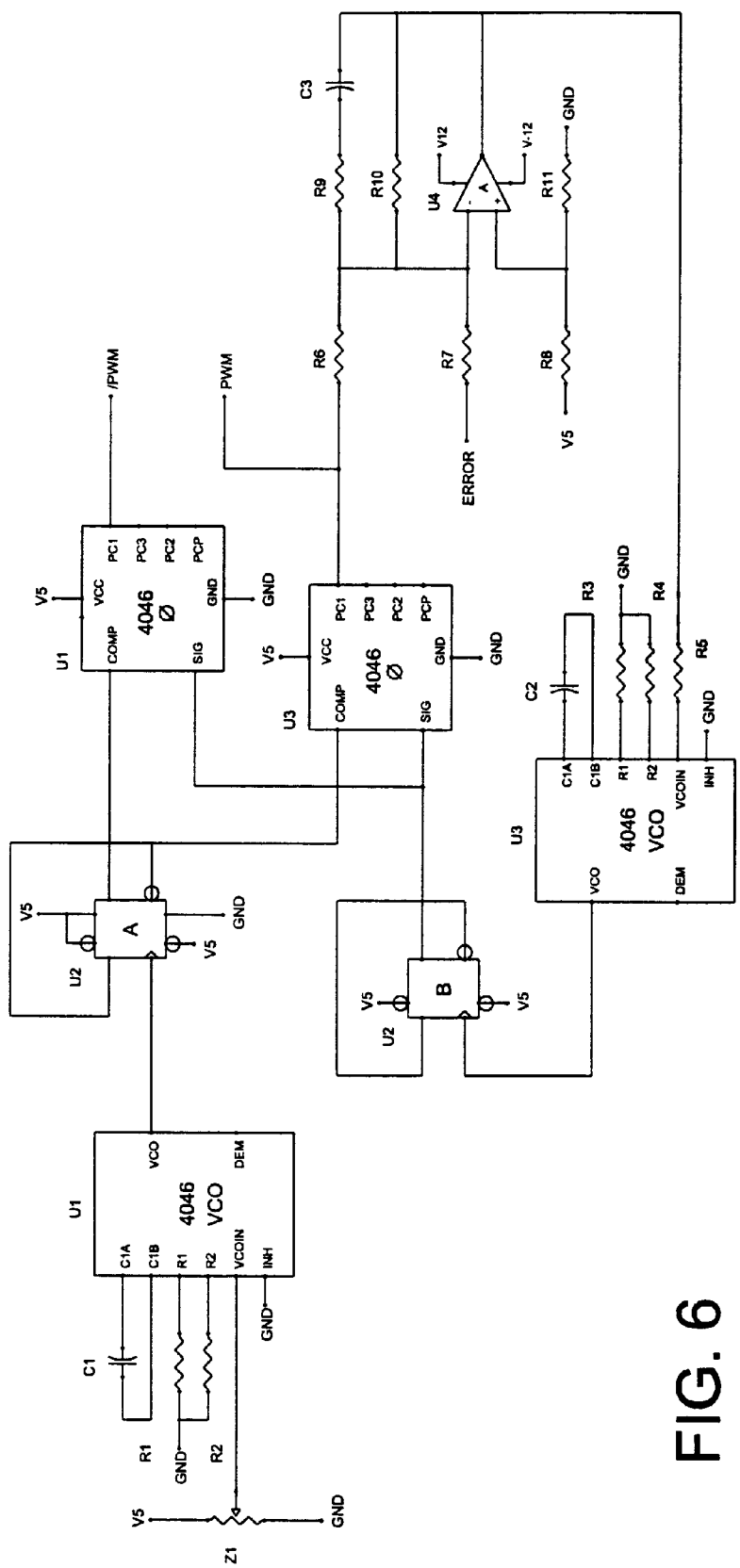
FIG. 6 illustrates the PLL-PWM portion of a class-D amplifier.
Figure 7:
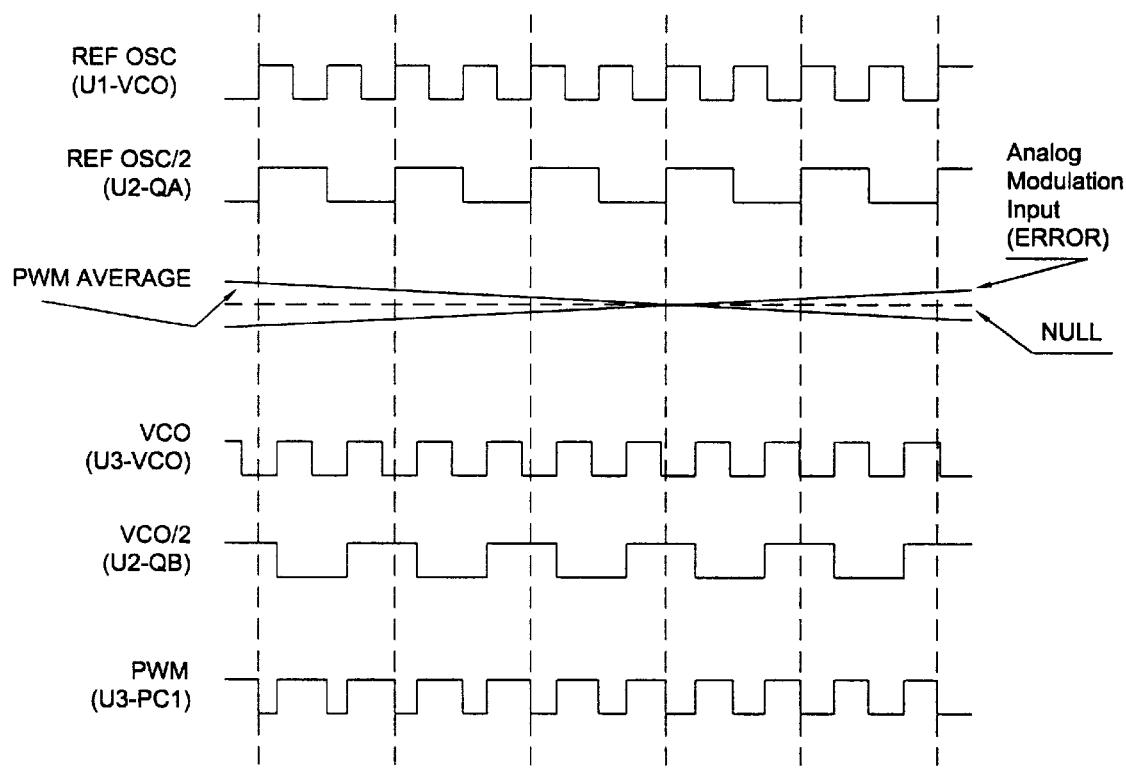
FIG. 7 Graphical representation of the signals of FIG. 6

FIG. 6 shows a preferred embodiment demonstrating a dual-loop controller, with an inner loop serving to provide loop lock when the output is disabled; and output regulation by sampling the output, when enabled. The circuit is the PLL-PWM portion of a 2 MHz full-bridge anti-phase PWM amplifier, with a passively filtered L-C output, yielding a clean power analog of the input. FIG. 7 illustrates the relationship of the various signals therein. Omitted for clarity from FIG. 6 are fault, disable and control logic, the MOSFET gate drivers, various analog signal conditioning, power distribution, output drive, and interface circuitry.

Two '4046 (HC/HCT4046A) PLL integrated circuits are used, wherein the '4046 contains a VCO and three phase detectors (PDs). The first '4046 (U3) serves as the PLL-PWM, with the U3 VCO serving as the loop VCO and the U3 PD serving as the loop PD. The other '4046 (U1), uses the U1 VCO section as the RO, with the U1 PD section (using a complemented clock) to generate the anti-phase /PWM signal. The XOR type PD is sensitive to duty-cycle, so both RO and VCO are divided-by-two and precisely squared-up using the D-flops of U2.

The U1 and U3 VCO sections are configured identically, so the input to both should always be identical at null. That is, if the U1 VCO input were varied, the U3 VCO input matches U1, which provides a convenient circuit nuller.

The loop filter consists of U4, an LF347 op-amp, configured as a lead-lag-summing amplifier. The loop filter U4 provides both filtering and summing of the PD output and the modulation input.

The U3 PD compares RO and Loop VCO signals in an exclusive-or gate, generating a PWM signal at twice the frequency of the two inputs, and a duty-cycle determined by the phase difference of the two.

The U1 PD is used to produce the /PWM because it is available and because the circuitry is identical to the U3 PD. The U1 PD receives an inverted VCO clock, so that /PWM mirrors PWM. The /PWM and PWM signals are used as the system pulse-width modulation signals for later application to the full-bridge.

The PWM signal is also input to the loop filter through R6, completing the inner loop; and combined with an Analog Modulated Input, also called 'ERROR', through R7, completing the outer loop in a summing amplifier using U4. The loop filter consists of R9, R10 and C3, also in conjunction with U4. Because the '4046 has internal logic components, it operates at typical logic voltages (5 Volts, in this case), so a 50% duty-cycle PWM corresponding to a null input would average to 2.5 Volts. The present circuit biases the non-inverting input to the op-amp at the same value, thus R8 and R11 establishes this null. Also, because the op-amp U4 is powered by ±12 Volts, the output can extend to these values, potentially damaging the input to U3, so R5 is provided to limit currents should this condition occur.

And, completing the loop, the output of the loop filter/summer goes to the U3 VCO input, to provide the feedback signal to the loop.

FIG. 7B illustrates the generation and modulation of the PLL-PWM signals, wherein the RO is operating at a fixed frequency, which may be asymmetrical. An XOR type PD requires a symmetrical square wave in order to generate a linear, symmetrical PWM representation, so the RO is squared up using U2, generating RO/2, at half the RO frequency. In other applications, the RO/2 signal may be used as one half of a phase-modulated configuration.

The VCO loop signal from U3 is operating at a variable frequency with the same requirements described for the RO. The VCO loop signal is squared up using U2, generating VCO/2, at half the VCO frequency. The VCO/2 signal may be used as the other half of a phase-modulated configuration.

The RO and VCO are compared in the XOR-type PD of U3, producing a PWM output representing the phase difference between the RO/2 and VCO/2 signals, at the same frequency as the original RO and VCO (assuming phase-locked). The PWM output of the PD U3 may be used as the system PWM for application to the output switches.

The Analog Modulation Input, corresponding to 'ERROR' in this circuit, is shown increasing in value. Since the RO and the VCO must remain in phase lock, the circuit null, labeled 'NULL', must remain constant. And, the necessary deviation to adjust the phase resulting from variations introduced by the Analog Modulation Input. In order to maintain NULL constant, the average output of the PD derived PWM signal (labeled 'PWM AVERAGE') must be equal and opposite in polarity to cancel the input signal. Since the PWM AVERAGE is derived from the PWM output of the PD, the duty-cycle of the PWM is seen decreasing. Furthermore, since the PWM signal is derived from the RO/2 and the VCO/2 signals, the signals are sliding past each other, with a phase difference corresponding to the PWM output.

The demonstration circuit, operating at a PWM frequency of about 2 MHz, with a loop bandwidth of about 20 kHz, cleanly reproduced analog input signals to the loop-filter bandwidth cutoff. PWM frequency adjustment is simply a matter of changing the RO and VCO frequency determining components and bandwidth varied by altering loop-filter components.

Figure 8:
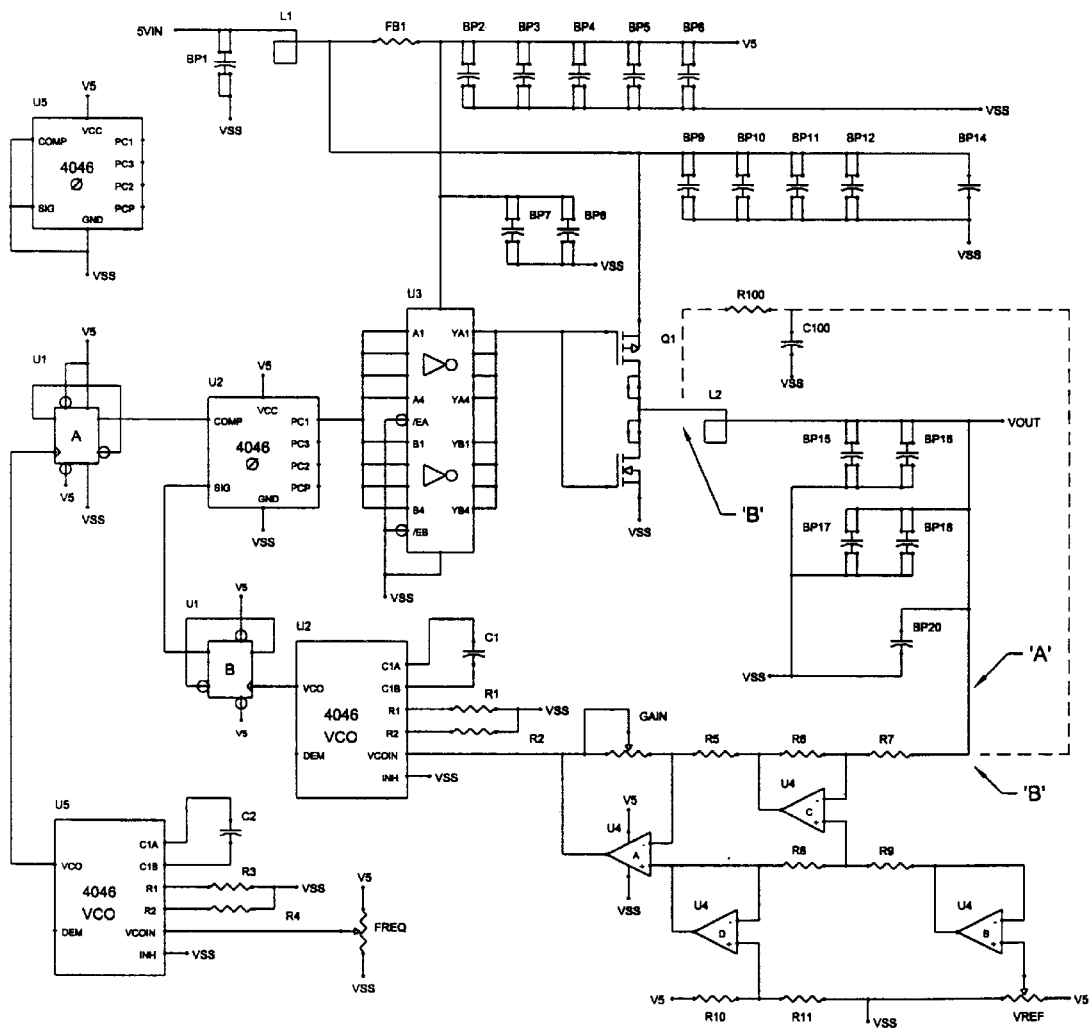
FIG. 8 shows a buck converter implemented using PLL-PWM.

Another circuit was fabricated to examine alternate feedback paths and topologies. FIG. 8 shows the complete schematic (less connectors) for a 5-Volt to 1-Volt/3-Amp synchronous buck converter switching at 5 MHz. With the inclusion of power components into the feedback loop, this circuit is essentially an industry standard 74HC4046 PLL IC on steroids, with the power output taken from the output of the loop filter. The components of the circuit relate to the elements of a PLL-PWM as follows:

RO: U5 (VCO)—74HC4046 operating as a free-running oscillator; U1A—74HC74 D-Flop used to square-up the asymmetrical output of U5 (VCO);

VCO: U2 (VCO); U1B—74HC74 D-Flop used to square-up the asymmetrical output of U2 (VCO);

PD: U2 (PD);

Output Filter: L2, 250 nH inductor, BP15–20, consisting of (8) 0.18 uF ceramic capacitors for ripple, and BP20 a 10 uF tantalum capacitor for transient response;

Summing Node: U4C, operating as a differential amplifier of Vout, and Vref;

Vref: U4B buffers Vref from pot 'VREF'.

The power and supporting devices are as follows:

Gate Driver: U3, a 74AC244 with paralleled outputs. The 'AC series of devices have superior speed (~5 ns) and driving capacity (~105 mA) to 'HC series devices. Furthermore, because of the speed of the circuit (ON time typically ~40 ns), no conventional gate driver circuit is adequate;

Q1: NDS8852 dual complementary MOSFET; and

MISC: U4D generates a virtual ground for the analog circuit, and U4A provides additional gain, as required. L1 @2 uH, serves as an input inductor. U5 (PD) is unused. And a prudent sprinkling of decoupling capacitors and other support components throughout. Note that ceramic surface mount capacitors, with double via pads were used, and reflected in some of the capacitors schematic symbols.

Various static and dynamic load conditions were tested at various input/output voltage combinations (around nominal). Ripple was found (as expected) to be about 25 mV, with perfect static regulation. Capture and transient response was within 2 output filter time constants (<10 us). Even though there is no explicit deadtime circuitry, the high-speed of U3 along with the high gate thresholds of Q1 mitigated shoot-thru. However, driving Q1 with logic signals provide full enhancement of the channels. Nevertheless, efficiencies of over 70% were achieved in this circuit.

However, the simplicity of this circuit was achieved by using the output filter as the loop filter. PLL loop filters need to be optimized for capture, tracking and damping; while output filters need to be optimized for ripple, transient response and efficiency. So using only one filter for both functions would always be a compromise.

In order to improve the transient response, while preserving the output filter characteristics, this circuit was modified to separate the loop and output filters. This involved cutting the existing feedback path at 'A', and adding C100 and R100, forming an explicit loop filter through connection 'B'. Connecting the two filters in parallel at the switched output causes the two to mimic each other on a static basis (allowing us to regulate), while offering independently tailored dynamic responses.

Fundamentally, the PLL-PWM signal's duty-cycle is a direct reflection of the Analog Modulation Input, with behavior identical to, and performance exceeding that of a classic ramp-comparison PWM techniques. This circuit additionally provides two phase-modulated outputs for applications previously described. Single-ended applications can take advantage of this performance without much PWM signal conditioning. Bridge-type applications must contend with cross-conduction concerns.

Other configurations provide enhanced capabilities. For example, multiple PLL-PWMs may be locked to a single RO, and be independently controlled in parallel. Or multiple PLL-PWMs may be cascaded for elaborate dependent phase control.

The operating frequency of the PLL-PWM can be varied without affecting the duty-cycle. This requires the RO to be a voltage controlled oscillator, and the RO and VCO to behave identically. Frequency modulation, without phase modulation, would result when varying the RO and VCO inputs identically. Phase modulation, without frequency modulation would result when varying the RO and VCO inputs differentially.

PLLs are already used in high-end microprocessors as clock multipliers. The same PLL may also be used to provide a PLL-PWM for main or auxiliary power control. Integrating the power controller would minimize real estate (and cost) by itself, and the high frequency switching permitted by this technique would further minimize inductor and capacitor sizes. Auxiliary PLL-PWMs for peripheral power, amplifiers or programmable pulse trains would similarly benefit.

The foregoing description of the preferred embodiment of the invention has been presented for the purpose of illustration and description. It is not intended to be exhaustive or to limit the invention to the precise form disclosed. Many modifications and variations are possible in light of the above teachings.

The invention is susceptible of many variations, all within the scope of the specification, figures, and claims. The preferred embodiment described here and illustrated in the figures should not be construed as in any way limiting.

No warranty is expressed or implied as to the actual degree of safety, security or support of any particular specimen of the invention in whole or in part, due to differences in actual production designs, materials and use of the products of the invention.

I claim:

1. A phase-locked-loop circuit configured as a phase modulator to generate a pulse width modulated signal comprising:

a reference oscillator which generates a reference oscillator signal;

a voltage controlled oscillator which generates a voltage controlled oscillator signal;

a phase detector connected to said reference oscillator and said voltage controlled oscillator, wherein said phase detector compares a phase relationship of said reference oscillator signal and said voltage controlled oscillator signal, and wherein said phase detector generates said pulse width modulated signal representing said phase relationship;

a power transistor controlled by said pulse width modulated signal to produce a power pulse width modulated signal;

a power low-pass filter connected to said power pulse width modulated signal, wherein said power low-pass filter converts said power pulse width modulated signal to an average output voltage; and a summing node connected to said power low-pass filter, wherein said summing node generates a difference signal between said average output voltage and an analog modulation input, and wherein said difference signal is fedback to said voltage controlled oscillator.

2. A phase-locked-loop circuit according to claim 1, wherein said analog modulation input is fixed.

3. A phase-locked-loop circuit according to claim 1, wherein said analog modulation input is variable.

4. A phase-locked-loop circuit according to claim 1, wherein said reference oscillator signal is fixed and said voltage controlled oscillator signal is variable.

5. A phase-locked-loop circuit configured as a phase modulator to generate a pulse width modulated signal according to claim 1, further comprising a second low-pass filter connected to said power pulse width modulated signal, wherein said second low-pass filter converts said power pulse width modulated signal to an average feedback voltage value, and wherein said summing node generates a feedback difference signal between said average feedback voltage value and said analog modulation input, and wherein said feedback difference signal is fedback to said voltage controlled oscillator.

6. A phase-locked-loop circuit configured as a phase modulator to generate a pulse width modulated signal according to claim 1, further comprising a second low-pass filter connected to said pulse width modulated signal, wherein said second low-pass filter generates a phase detector voltage, and further comprising a second summing node, wherein said second summing node generates a second difference signal between said difference signal and said phase detector voltage, and wherein said second difference signal is fedback to said voltage controlled oscillator.

7. A phase-locked-loop circuit configured as a phase modulator to generate two phase modulated signals comprising:
- a reference oscillator which generates a reference oscillator signal;
- a voltage controlled oscillator which generates a voltage controlled oscillator signal;
- a plurality of power transistors, wherein a first set of power transistors is controlled by said reference oscillator, and a second set of power transistors is controlled by said voltage controlled oscillator;
- an output power means, wherein a phase modulation between said first and second set of power transistors translates into a power pulse width modulated signal when coupled through said output power means;
- a power low-pass filter connected through a rectifier to said output power means, wherein said power low-pass filter converts said power pulse width modulated signal to an average output voltage; and
- a summing node connected to said power low-pass filter, wherein said summing node generates a difference signal between said average output voltage and an analog modulation input, and wherein said difference signal is fedback to said voltage controlled oscillator.

8. A phase-locked-loop circuit configured as a phase modulator to generate two phase modulated signals according to claim 7, wherein said plurality of power transistors are configured in a full bridge, and wherein said first set of power transistors is on a first leg of said full bridge, and is controlled by said reference oscillator, and said second set of power transistors is on a second leg of said full bridge, and is controlled by said voltage controlled oscillator.

9. A phase-locked-loop circuit configured as a phase modulator to generate two phase modulated signals according to claim 8, wherein said output power means is an output power transformer connected across said full bridge, and wherein said phase modulation between said first and second set of power transistors translates into a power pulse width modulated signal when coupled through said output power transformer.

10. A phase-locked-loop circuit according to claim 7, wherein said analog modulation input is fixed.

11. A phase-locked-loop circuit according to claim 7, wherein said analog modulation input is variable.

12. A phase-locked-loop circuit according to claim 7, wherein said reference oscillator signal is fixed and said voltage controlled oscillator signal is variable.

13. A phase-locked-loop circuit configured as a phase modulator to generate two phase modulated signals according to claim 7, further comprising a second low-pass filter, wherein said second low-pass filter converts said power pulse width modulated signal into an average feedback voltage, and wherein said summing node generates a feedback difference signal between said average feedback voltage and said analog modulation input, and wherein said feedback difference signal is fedback to said voltage controlled oscillator.

14. A phase-locked-loop circuit configured as a phase modulator to generate two phase modulated signals according to claim 7, further comprising a second low-pass filter connected to said pulse width modulated signal, wherein said second low-pass filter generates a phase detector voltage, and further comprising a second summing node, wherein said second summing node generates a second difference signal between said difference signal and said phase detector voltage, and wherein said second difference signal is fedback to said voltage controlled oscillator.

15. A phase-locked-loop process to generate a pulse width modulated signal comprising the steps of:
- generating a reference oscillator signal;
- generating a voltage controlled oscillator signal;
- comparing a phase relationship of said reference oscillator signal and said voltage controlled oscillator signal, and generating said pulse width modulated signal representing said phase relationship;
- controlling said pulse width modulated signal to produce a power pulse width modulated signal;
- filtering said power pulse width modulated signal and converting said power pulse width modulated signal to an average output voltage;
- generating a difference signal between said average output voltage and an analog modulation input; and
- feeding back said difference signal to said voltage controlled oscillator.

16. A phase-locked-loop process to generate a pulse width modulated signal according to claim 15, comprising the further steps of filtering said power pulse width modulated signal and converting said power pulse width modulated signal to an average feedback voltage value, generating a feedback difference signal between said average feedback voltage value and said analog modulation input, and feeding back said feedback difference signal to said voltage controlled oscillator.

17. A phase-locked-loop process to generate a pulse width modulated signal according to claim 15, comprising the further steps of filtering said pulse width modulated signal and converting said pulse width modulated signal to a phase detector voltage, and generating a second difference signal between said difference signal and said phase detector voltage, and feeding back said second difference signal to said voltage controlled oscillator.

* * * * *